US008258866B2

(12) United States Patent
Saiz et al.

(10) Patent No.: US 8,258,866 B2
(45) Date of Patent: Sep. 4, 2012

(54) POWER AMPLIFIERS

(75) Inventors: Nicholas D. Saiz, San Jose, CA (US); Sam J. Waldbaum, Mountain View, CA (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 12/939,091

(22) Filed: Nov. 3, 2010

(65) Prior Publication Data

US 2012/0105149 A1     May 3, 2012

(51) Int. Cl.
*H03F 3/68*     (2006.01)
(52) U.S. Cl. .................. 330/124 R; 330/295; 330/286
(58) Field of Classification Search ............ 330/295, 330/124 R, 53, 84, 286, 310, 98, 133, 150
See application file for complete search history.

(56) References Cited

U.S. PATENT DOCUMENTS

| | | | | |
|---|---|---|---|---|
| 5,329,248 | A * | 7/1994 | Izadian | 330/295 |
| 5,339,057 | A * | 8/1994 | Rauscher | 333/166 |
| 5,977,843 | A * | 11/1999 | Watanabe | 333/127 |
| 6,922,106 | B2 * | 7/2005 | Lautzenhiser et al. | 330/295 |
| 7,466,203 | B2 * | 12/2008 | Rector | 330/295 |
| 7,760,025 | B2 | 7/2010 | Kee et al. | |
| 8,130,057 | B2 * | 3/2012 | Jones et al. | 333/131 |
| 2010/0244981 | A1 * | 9/2010 | Gorbachov | 333/124 |

OTHER PUBLICATIONS

Kalantari, et al., "A 19.4 dBm, Q-Band Class-E Power Amplifier in a 0.12 um SiGe BiCMOS Process", IEEE Microwave and Wireless Components Letters, Feb. 10, 2010, pp. 1-3.
Noh, et al., "A Compact Ku-Band SiGe Power Amplifier MMIC With On-Chip Active Biasing", IEEE Microwave and Wireless Components Letters, Jan. 24, 2010, pp. 1-3.
Niknejad, et al., "Integrated Circuit Transmission-Line Transformer Power Combiner for Millimetre-Wave Applications", Electronic Letters, Mar. 1, 2007, vol. 43, No. 5.
Aoki, et al., "Distributed Active Transformer—A New Power-Combining and Impedance-Transformation Technique", IEEE Transactions on Microwave Theory and Techniques, Jan. 2002, vol. 50, No. 1, pp. 316-331.

* cited by examiner

*Primary Examiner* — Hieu Nguyen
(74) *Attorney, Agent, or Firm* — McDermott Will & Emery LLP

(57) ABSTRACT

Various aspects of the disclosure provide high power and high efficiency power amplifier systems that can be integrated on a chip using integrated circuit processes such as a standard CMOS and SiGe process. A power amplifier system is disclosed according to one aspect. The power amplifier system comprises a first power amplifier, a Wilkinson power splitter, second-stage amplifiers, and a Wilkinson power combiner. The first power amplifier pre-amplifies an RF input signal. The Wilkinson power splitter then splits the power of the amplified RF signal outputted by the first power amplifier among the second-stage amplifiers. Each of the second-stage amplifiers amplifies the respective RF signal from the Wilkinson power splitter. The Wilkinson power combiner then sums the powers of the amplified RF signals outputted by the second-stage amplifiers and outputs the resulting combined RF signal.

12 Claims, 3 Drawing Sheets

POWER AMPLIFIERS

STATEMENT REGARDING FEDERALLY SPONSORED RESEARCH OR DEVELOPMENT

Not applicable.

FIELD

The present invention generally relates to amplification, and more particularly to power amplifiers.

BACKGROUND

A power amplifier may be used to amplify a radio frequency (RF) signal to drive a load, e.g., an antenna in a transmitter. Integration of high power and high efficiency power amplifiers using integrated circuit processes is challenging due to limitations in integrated circuits such as lower power supply voltages and low oxide breakdown voltages.

SUMMARY OF THE INVENTION

Various aspects of the disclosure provide high output power and high efficiency power amplifier systems that can be integrated on a chip using integrated circuit processes such as standard CMOS and SiGe BiCMOS processes.

In one aspect, a power amplifier system is disclosed. The power amplifier system comprises a first power amplifier, a Wilkinson power splitter, second-stage amplifiers, and a Wilkinson power combiner. The first power amplifier pre-amplifies an RF input signal. The Wilkinson power splitter then splits the power of the amplified RF signal outputted by the first power amplifier among the second-stage amplifiers. Each of the second-stage amplifiers amplifies the respective RF signal from the Wilkinson power splitter. The Wilkinson power combiner then sums the powers of the amplified RF signals outputted by the second-stage amplifiers and outputs the resulting combined RF signal to a load. By summing the powers of the second-stage amplifiers using the Wilkinson power combiner, the power amplifier system is able to achieve higher output power and efficiency using integrated power amplifiers.

In one aspect, the Wilkinson power splitter and the Wilkinson power combiner are implemented using a compact lumped Wilkinson architecture to achieve integration of the Wilkinson power splitter and the Wilkinson power combiner on a chip.

Additional features and advantages of the invention will be set forth in the description below, and in part will be apparent from the description, or may be learned by practice of the invention. The advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

DETAILED DESCRIPTION

Various aspects of the disclosure provide high output power and high efficiency power amplifier systems that can be integrated on a chip using integrated circuit processes such as standard CMOS and SiGe processes. In one aspect, a power system comprises a first power amplifier, a Wilkinson power splitter, second-stage amplifiers, and a Wilkinson power combiner. The first power amplifier pre-amplifies an RF input signal. The Wilkinson power splitter then splits the pre-amplified RF signal among the second-stage amplifiers. Each second stage-amplifier amplifies the respective RF signal from the Wilkinson power splitter. The Wilkinson power combiner then sums the powers of the amplified RF signals outputted by the second-stage amplifiers and outputs the resulting combined RF signal to a load, e.g., an antenna. By summing the powers of the second-stage amplifiers using the Wilkinson power combiner, the power amplifier system is able to achieve higher output power and efficiency. In one aspect, the Wilkinson power splitter and the Wilkinson power combiner are implemented using a compact lumped Wilkinson architecture to achieve integration of the Wilkinson power splitter and the Wilkinson power combiner on a chip. This allows integration of the power amplifier system on a chip using integrated circuit processes such as standard CMOS and SiGe processes.

Figure 1:
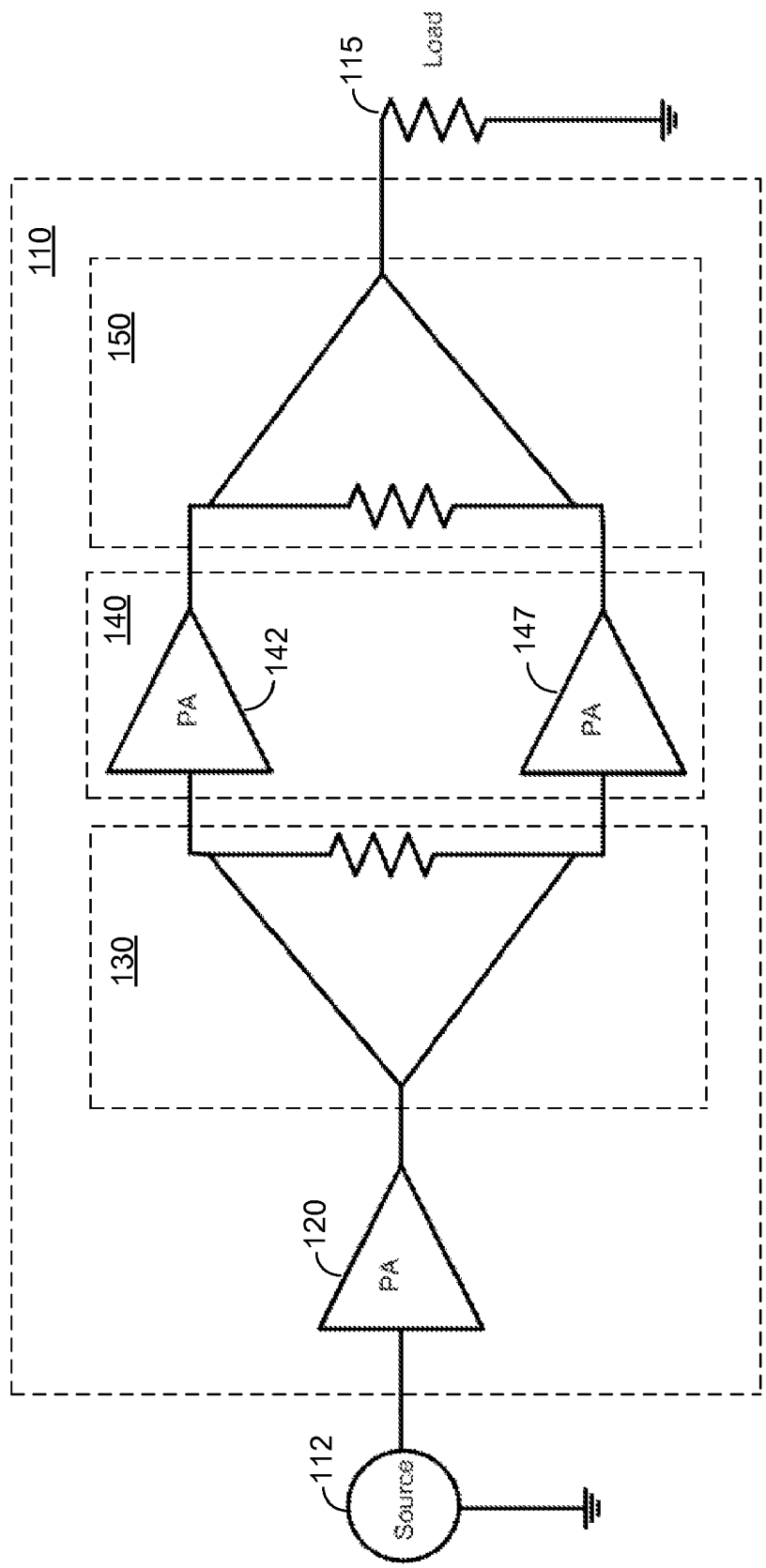
FIG. 1 is a conceptual diagram showing a power amplifier system according to an aspect of the disclosure.

FIG. 1 shows a power amplifier system 110 according to one aspect of the present invention. The power amplifier system 110 may be used to amplify the power of a radio frequency (RF) signal from a source 112 and output the resulting power amplified RF signal to a load 115 (e.g., an antenna).

The power amplifier system 110 comprises a first power amplifier 120, a Wilkinson power splitter 130, second-stage power amplifiers 140, and a Wilkinson power combiner 150. In the example shown in FIG. 1, the second-stage power amplifiers 140 comprise a second power amplifier 142 and a third power amplifier 147.

The first power amplifier 120 receives an RF input signal from the source 112, amplifies the RF input signal and outputs the amplified RF signal to the Wilkinson power splitter 130. The Wilkinson power splitter 130 evenly splits the power of the amplified RF signal outputted by the first power amplifier 120 between the inputs of the second and third power amplifiers 142 and 147. Each of the second and third power amplifiers 142 and 147 amplifies the respective RF signal from the Wilkinson power splitter 130. The Wilkinson combiner 150 sums the powers of the amplified RF signals outputted by the second and third power amplifiers 142 and 147 and outputs the resulting combined RF signal to the load 115.

In one aspect, the first power amplifier 120 may be used to pre-amplify the RF input signal to compensate for losses associated with the Wilkinson power splitter 130 and therefore increase gain. There may be losses in the Wilkinson power splitter 130 due to power splitting and other factors depending on the design of the Wilkinson power splitter 130. Other benefits of the first power amplifier 120 are discussed below.

In one aspect, the Wilkinson power splitter 130 evenly splits the power of the RF signal outputted by the first power amplifier 120 between the inputs of the second and third power amplifiers 142 and 147. The Wilkinson power splitter 130 also presents a load impedance (e.g., 50 ohms) to the first power amplifier 120 that is matched with the impedance of the first power amplifier 120. This load matching ensures maximum power transfer between the first power amplifier 120 and the Wilkinson power splitter 130.

Figure 2:
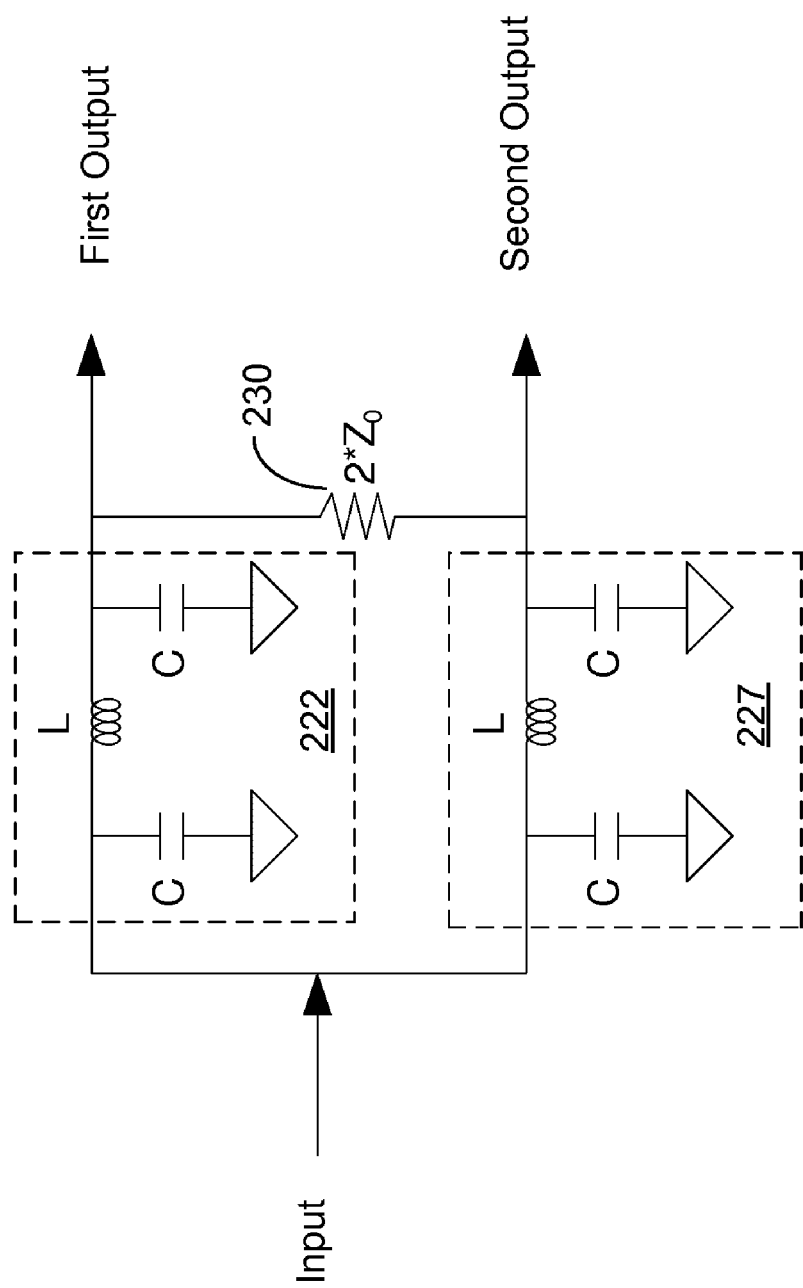
FIG. 2 is a circuit schematic of a lumped-element Wilkinson power splitter according to an aspect of the disclosure.

Referring to FIG. 2, the Wilkinson power splitter 130 may be implemented using a lumped-element Wilkinson power splitter. The lumped-element Wilkinson power splitter 130 comprises first and second LC circuits 222 and 227 and a resistor 230. Each LC circuit 222 and 227 comprises one inductor L and two capacitors C that provide a lumped LC circuit equivalent of a transmission line. The capacitance of each capacitor C and the inductance of each inductor L may be given as follows:

$$C = 1/\sqrt{2} \cdot \omega \cdot Z_0 \quad (1)$$

$$L = \sqrt{2} \cdot Z_0 / \omega \quad (2)$$

$$\omega = 2 \cdot \pi \cdot f \quad (3)$$

where $Z_0$ is a desired load impedance of the Wilkinson power splitter 130 and f is a desired operating frequency of the power amplifier system 110. In one aspect, the load impedance $Z_0$ is matched with the impedance of the first power amplifier 120 to ensure maximum power transfer between the first power amplifier 120 and the Wilkinson power splitter 130. The operating frequency f may equal the center frequency of the RF signal to be amplified.

An advantage of using the lumped-element Wilkinson power splitter 130 is that it consumes much less chip space than a traditional Wilkinson power splitter comprising ¼ wavelength microstrip transmission lines. A traditional Wilkinson power splitter is not suitable for chip integration at lower frequencies. This is because the dimensions of the ¼ wavelength microstrip transmission lines used in a traditional Wilkinson power splitter become much too large at lower frequencies to be integrated on a chip. This limitation makes a traditional Wilkinson power splitter unsuitable for commercial cellular applications. In contrast, the lumped-element Wilkinson power splitter 130 is considerable smaller than an equivalent traditional Wilkinson power splitter, which allows the lumped-element Wilkinson power splitter 130 to be integrated on a chip with the power amplifier 120, 142 and 147 to achieve higher density. With higher density, the output power can be increased for a given area.

Referring back to FIG. 1, after the Wilkinson power splitter splits the power of the RF signal between the inputs of the second and third power amplifiers 142 and 147, each of the second and third power amplifiers 142 and 147 amplifies the respective RF signal. As discussed above, the Wilkinson power combiner 150 sums the powers of the amplified RF signals outputted by the second and third power amplifiers 142 and 147 and outputs the resulting combined RF signal to the load 115.

The second and third power amplifiers 142 and 147 allow the power amplifier system 110 to achieve high gain and high output power using integrated power amplifiers. The gain of an individual power amplifier in an integrated circuit may be limited by a low power supply voltage, a low oxide breakdown voltage, and/or other limitation. By using two power amplifiers 142 and 147 and summing their powers with the Wilkinson power combiner 150, the power amplifier system 110 is able to achieve high gain and high output power using integrated power amplifiers. For example, if the output power of each power amplifier 142 and 147 is only ½ watt, then the output power of the power amplifier system 110 can be as high as a watt.

The Wilkinson power combiner 150 may be implemented using a lumped-element Wilkinson power combiner similar to the lumped-element Wilkinson power splitter 130 shown in FIG. 2 using lumped LC circuit equivalents of transmission lines. The lumped-element Wilkinson power combiner 150 can be integrated on a chip using integrated inductors and capacitors that consume much less chip area than equivalent ¼ wavelength microstrip transmission lines. This allows the Wilkinson power combiner 150 to be integrated on a single chip with the power amplifiers 120, 142 and 147 and the Wilkinson power splitter 130 to achieve a high density power amplifier system 110.

In one aspect, the Wilkinson power combiner 150 presents a load impedance (e.g., 50 ohms) to each of the second and third power amplifiers 142 and 147 that matches the impedance of each of the second and third power amplifiers 142 and 147. This load matching ensures maximum gain and efficiency. In addition, when the power amplifiers 142 and 147 and the Wilkinson power combiner 150 are integrated on the same chip, the Wilkinson power combiner 150 isolates the outputs of the second and third power amplifiers 142 and 147 from package parasitics (e.g., parasitic inductances and/or capacitances from output pads, bond wires, etc.). This prevents the package parasitics from directly loading the second and third power amplifiers 142 and 147, which can result in load mismatch and lower efficiency. In this aspect of the present invention, the second and third power amplifiers 142 and 147 are insensitive to package parasitics since they are loaded by the Wilkinson power combiner 150 on the same chip.

The lumped Wilkinson power splitter and combiner may be integrated on a chip using a standard complementary metal oxide silicon (CMOS) and silicon-germanium (SiGe) processes. For example, the inductors L of the lumped Wilkinson power splitter and combiner may be implemented using integrated spiral inductors, slab inductors or other type of integrated inductor. This allows the lumped Wilkinson power splitter and combiner to be integrated with the power amplifiers 120, 142 and 147 on a single chip to achieve a high density power amplifier system 110 and higher power output for a given chip area.

In one aspect, the power amplifiers 120, 142 and 147 may be implemented using Class E or F amplifiers. For example, Class E amplifiers are highly efficient switching power amplifiers that are capable of operating at high frequencies, and may be used to amplify phase modulated and/or pulse width modulated RF signals. In this aspect, the Class E pre-amplifier 120 improves the power added efficiency (PAE) of the power amplifier system 110 by driving the second-stage Class E amplifiers 142 and 147 into saturation mode. The Class E pre-amplifier also compensates for any loss in the Wilkinson power splitter 330 and ensures that there is a high gain to achieve high PAE.

In another aspect, the power amplifiers 120, 142 and 147 may be implemented using Class A, B or AB amplifiers. For example, Class AB amplifiers are efficient linear amplifiers, which may be used to amplify amplitude modulated RF signals such as quadrature amplitude modulation (QAM) signals. It is to be appreciated that the types of amplifiers given above are exemplary only and that other types of amplifiers may be used as well.

Figure 3:
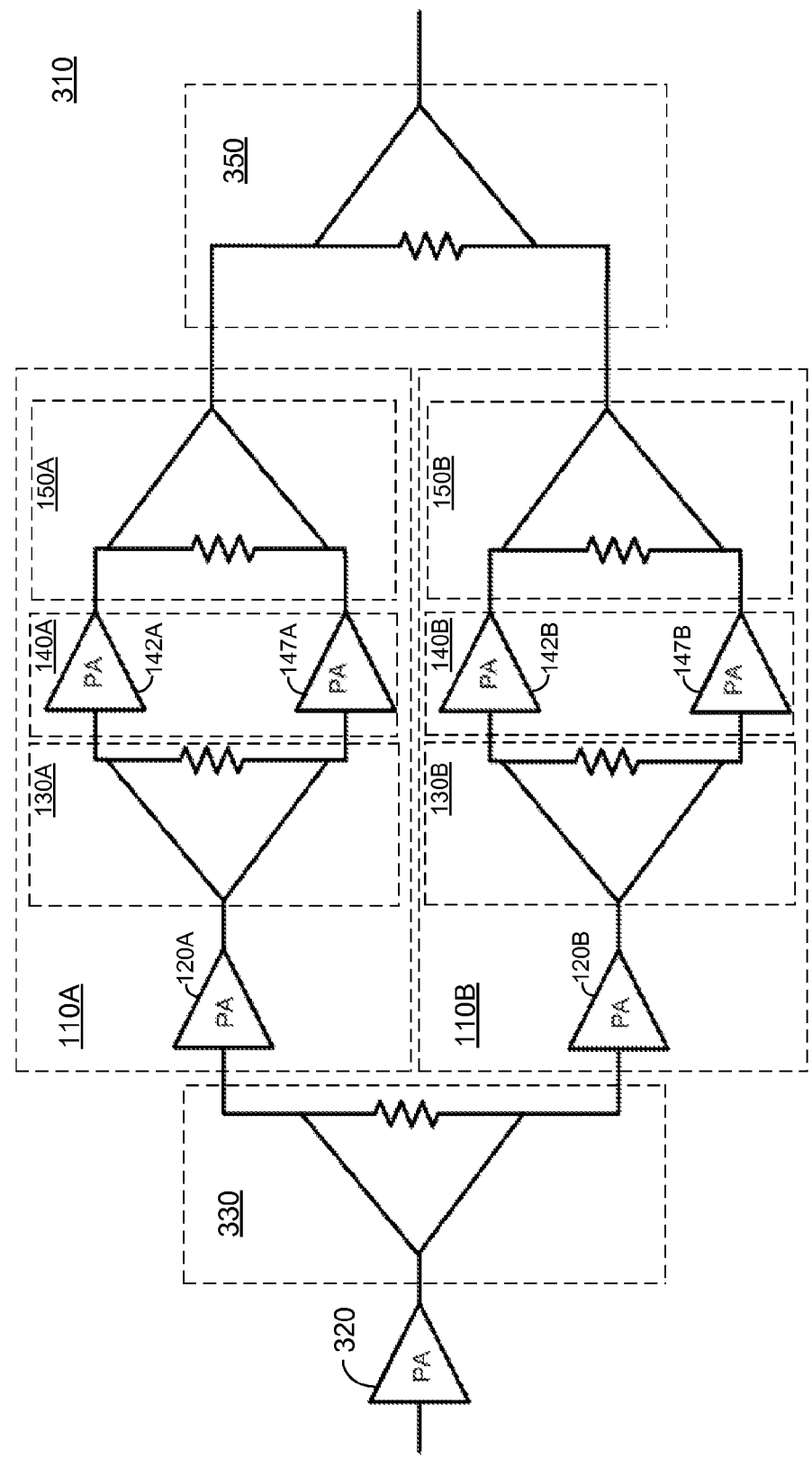
FIG. 3 is a conceptual diagram showing a power amplifier system according to another aspect of the disclosure.

The amplifier system 110 shown in FIG. 1 may by used as a building block to build higher power amplifier systems. FIG. 3 shows an example of a power amplifier system 310 comprising first and second amplifier blocks 110A and 110B, where each amplifier block 110A and 110B may be implemented using the amplifier system 110 shown in FIG. 1. The amplifier system 310 further comprises a power amplifier 320, a Wilkinson power splitter 330 and a Wilkinson power combiner 350.

Each amplifier block 110A and 110B comprises a first power amplifier 120A and 120B configured to amplify the RF signal from one of the outputs of the Wilkinson power splitter 330, a Wilkinson power splitter 130A and 130B, second-stage amplifiers 140A and 140B, and a Wilkinson power combiner 150A and 150B. The operation of each amplifier block 110A and 110B is explained in the above description of the amplifier system 110, and is therefore not repeated here. The output of each amplifier block 110A and 110B is coupled to one of the inputs of the Wilkinson power combiner 350.

The first power amplifier 320 receives an RF input signal from a source (not shown in FIG. 3), amplifies the RF input signal and outputs the amplified RF signal to the Wilkinson power splitter 330. The Wilkinson power splitter 330 evenly splits the power of the amplified RF signal outputted by the power amplifier 320 between the inputs of the first and second amplifier blocks 110A and 110B. Each of the first and second amplifier blocks 110A and 110B amplifies the respective RF signal from the Wilkinson power splitter 330. The Wilkinson combiner 350 sums the powers of the amplified RF signals outputted by the first and second amplifier blocks 110A and 110B and outputs the resulting combined RF signal to a load (not shown in FIG. 3). The load may be an antenna.

Thus, a combination of two or more amplifier blocks can be used to achieve higher output power, where each amplifier block may be implemented using the amplifier system 110 in FIG. 1. In the example shown in FIG. 3, the Wilkinson power combiners 150A, 150B and 350 sum the powers of the amplified RF signals outputted by four power amplifiers 142A, 147A, 142B and 147B. By summing the powers of four power amplifiers 142A, 147A, 142B and 147B, the amplifier system 310 is able to achieve higher output power even when the gain of each individual power amplifier may be limited due to device limitations in an integrated circuit. As a result, the power amplifier system 310 is able to provide higher output power without damaging transistors in an integrated circuit fabricated using bulk sub-micrometer CMOS and SiGe processes.

The power amplifier systems according to various aspects of the present invention may be used in many applications requiring power amplification. For example, power amplifier systems according to various aspects may be used in transmitters to amplify RF signals in the S band to Q band or other frequency band.

In another example, a power amplifier system according to an aspect may be used in a wireless mobile device (e.g., cellular phone) to drive an antenna. The high efficiency of the amplifier power system extends the battery life of the mobile device while achieving high output power. In this example, the source of the RF signal may be a component that performs frequency up-conversion (e.g., a mixer), a modulator, another power amplifier and/or other component of the mobile device.

In another example, power amplifier systems according to various aspects may also be used to drive multiple antennas in a multi-antenna system such as a system with a phased antenna array. In this example, each power amplifier system may be used to drive one of the antennas (e.g., patch antenna) of the multi-antenna system. For the example of a phased array, the power amplifier system may amplify RF signals from a beamformer or may be integrated in a beamformer. In this example, the power amplifiers may be operated in Class E mode to allow for beam shaping in the phased array. The power amplifier systems may also be used to amplify RF signals in a geodesic dome phased array antenna (GDPAA) system that controls numerous radiating elements.

The description is provided to enable any person skilled in the art to practice the various aspects described herein. The previous description provides various examples of the subject technology, and the subject technology is not limited to these examples. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the invention.

A phrase such as an "aspect" does not imply that such aspect is essential to the subject technology or that such aspect applies to all configurations of the subject technology. A disclosure relating to an aspect may apply to all configurations, or one or more configurations. An aspect may provide one or more examples. A phrase such as an aspect may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. An embodiment may provide one or more examples. A phrase such an embodiment may refer to one or more embodiments and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples. A phrase such a configuration may refer to one or more configurations and vice versa.

The word "exemplary" is used herein to mean "serving as an example or illustration." Any aspect or design described herein as "exemplary" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:
1. A transmission system, comprising:
a first power splitter having an input, a first output, and a second output, wherein the power splitter is configured to split the power of a radio frequency (RF) signal received at the input between the first and second outputs;

a first amplifier block configured to amplify the RF signal from the first output of the power splitter;

a second amplifier block configured to amplify the RF signal from the second output of the power splitter; and a first output power combiner configured to sum the powers of the amplified RF signals outputted by the first and second amplifier blocks;

wherein each of the first and second amplifier blocks comprises:

a first power amplifier configured to amplify the RF signal from the respective output of the first power splitter;

a Wilkinson power splitter having an input coupled to an output of the first power amplifier, a first output, and a second output, wherein the Wilkinson power splitter is configured to split the power of the amplified RF signal outputted by the first power amplifier between the first and second outputs;

a second power amplifier configured to amplify the RF signal from the first output of the Wilkinson power splitter;

a third power amplifier configured to amplify the RF signal from the second output of the Wilkinson power splitter; and a Wilkinson power combiner having a first input coupled to an output of the second power amplifier and a second input coupled to an output of the third power amplifier, wherein the Wilkinson power combiner is configured to sum the powers of the amplified RF signals outputted by the second and third power amplifiers and to output the resulting RF signal to the first power combiner.

2. The power amplifier system of claim 1, further comprising a fourth power amplifier coupled to the input of the first power splitter to pre-amplify the RF signal inputted to the first power splitter.

3. The power amplifier system of claim 1, wherein the first power splitter comprises a Wilkinson power splitter.

4. The power amplifier system of claim 1, wherein each of the first, second and third power amplifiers comprises a Class E or class F amplifier.

5. The power amplifier system of claim 1, wherein each of the first, second and third power amplifiers comprises a Class AB amplifier.

6. The power amplifier system of claim 1, wherein the Wilkinson power splitter is a lumped-element Wilkinson power splitter comprising at least one capacitor and at least one inductor.

7. The power amplifier system of claim 1, wherein the Wilkinson power combiner is a lumped-element Wilkinson power combiner comprising at least one capacitor and at least one inductor.

8. The power amplifier system of claim 1, wherein an output of the first power combiner is coupled to an antenna.

9. The power amplifier system of claim 1, wherein the Wilkinson power splitter has a load impedance that is matched with an impedance at the output of the first power amplifier.

10. The power amplifier system of claim 1, wherein the Wilkinson power combiner has a load impedance that is matched with an impedance at the output of each of the second and third power amplifiers.

11. The power amplifier system of claim 1, wherein the first power splitter, the first and second amplifier blocks and the first power combiner are all integrated on a single chip.

12. A transmission system, comprising:

a first power splitter having an input, a first output, and a second output, wherein the power splitter is configured to split the power of a radio frequency (RF) signal received at the input between the first and second outputs;

a first amplifier block having an input coupled to the first output of the first power splitter, and an output;

a second amplifier block having an input coupled to the second output of the first power splitter, and an output;

a first output power combiner having a first input coupled to the output of the first amplifier block, a second input coupled to the output of the second amplifier block, and an output; and an antenna coupled to the output of the first output power combiner;

wherein each of the first and second amplifier blocks comprises:

a first power amplifier having an input coupled to the respective output of the first power splitter, and an output a Wilkinson power splitter having an input coupled to the output of the first power amplifier, a first output, and a second output;

a second power amplifier coupled to the first output of the Wilkinson power splitter;

a third power amplifier coupled to the second output of the Wilkinson power splitter; and a Wilkinson power combiner having a first input coupled to the output of the second power amplifier, a second input coupled to the output of the third power amplifier, and an output coupled to the respective input of the first output power combiner.

* * * * *